Dec. 7, 1965 B. L. WELLER ETAL 3,221,388

METHOD OF MAKING A STACKED CAPACITOR

Filed Nov. 16, 1962 2 Sheets-Sheet 1

INVENTORS
Barton L. Weller
William R. Belko, Jr.
BY
Johnson and Kline
ATTORNEYS

Dec. 7, 1965 B. L. WELLER ETAL 3,221,388

METHOD OF MAKING A STACKED CAPACITOR

Filed Nov. 16, 1962

2 Sheets-Sheet 2

INVENTORS
Barton L. Weller
William R. Belko, Jr
BY
Johnson and Kline
ATTORNEYS

United States Patent Office 3,221,388
Patented Dec. 7, 1965

3,221,388
METHOD OF MAKING A STACKED CAPACITOR

Barton L. Weller, Monroe, and William R. Belko, Jr., Huntington, Conn., assignors to Vitramon, Incorporated, Monroe, Conn., a corporation of Delaware Filed Nov. 16, 1962, Ser. No. 238,174
6 Claims. (Cl. 29—25.42)

This invention relates to stacked capacitors. More specifically, it pertains to a method of making such capacitors and to preforms for use in making the same.

Heretofore, stacked capacitors have been made, according to known methods, by stacking a plurality of preformed capacitor units, each unit including a wafer of dielectric material having a pattern of electrically conductive material of predetermined size and shape on the opposite surfaces thereof, and then electrically connecting the alternate electrically conductive plates or electrodes formed by the complementary, engaging electrically conductive patterns of adjacent units. In accordance with the prior methods, the electrically conductive patterns are formed on their respective wafers in such a manner that they are surrounded by a border of the dielectric material of the wafer and are provided with integral means extending across the border for electrically communicating them to the edge of the wafer. The integral communicating means of each pattern, which normally does not overlie the communicating means of the pattern on the opposite surface of the respective wafer, but corresponds in position to the communicating means of the complementary, engaging pattern of the adjacent unit in the stacked assembly of the units, provides the connection means for electrically connecting alternate electrode plates in the stack.

The prior stacking methods, while they have proven useful in providing capacitors having desired characteristics, have presented a number of problems in the area of manufacture and, further, have failed to produce products of consistently high reliability.

The varied shapes of the patterns, resulting from forming the communicating means as an integral part of the pattern and the necessity of having the pattern on one surface of a wafer differing in shape and/or orientation from the pattern on the opposite surface of the wafer, in respect to the communicating means, inherently creates difficulties in forming the patterns on opposed surfaces of a wafer in a predetermined manner relative to one another. Further, in stacking electrical units with correspondingly shaped and oriented patterns in engagement for forming the electrodes of the stacked capacitor, problems exist in accurately aligning the engaging patterns to achieve the desired electrical results.

It is evident that the foregoing manufacturing problems, particularly when they are related to the manufacture of miniature and micro-miniature capacitors and the wafer material of the unit is of fragile character, are not conductive to high speed quantity production and require time consuming aligning operations, often by hand, which result in breakage and increased manufacturing costs. Also, the difficulties in forming and aligning the patterns to form the electrodes, along with the problems of electrically connecting the alternate electrodes in the stack, resulting from the necessity of making electrical connection to pattern communicating means which extend to but not over the edges of the wafers, seriously affect the reliability of the finished product as to operation and characteristics.

The present invention overcomes the problems aforenoted and has as an important object thereof the provision of a method for manufacturing stacked capacitors, wherein the difficulties of aligning engaging patterns of adjacent units to form the electrodes of the capacitor are reduced and the necessity of maintaining precision orientation of the patterns and their communicating means, which enables alternate electrodes in the stack to be connected, is eliminated.

According to the invention, the aforenoted object is achieved by forming the stacked capacitor from identical capacitor units, in which the electrically conductive patterns on the opposite surfaces of each wafer are similarly oriented and shaped, and then connecting the alternate electrodes by independent electrically conductive means folded in the stack.

In the prefered method of the invention, the means utilized for connecting the alternate electrodes comprises a flexible, elongate foil strip and may preferably be formed from a solder foil preform including the foil strip and sufficient solder to make the desired electrical connection. In accordance with the method, the capacitor units, bearing their identical opposed patterns, are positioned on a supporting surface, so that the patterns which will ultimately form one group of electrode plates of the stacked capacitor face in one direction and the patterns for forming the other group face in the opposite direction, and then the foil connector strips are connected to corresponding electrode forming patterns that are not adapted to be in engagement in the stacked assembly of the units and the units are thereafter folded into the stack.

Accordingly, it is also an object of the invention to provide a method of making stacked capacitors, wherein the connections for connecting the alternate electrodes of the stacked capacitor are made prior to the stacking of the capacitor units and the formation of the electrodes.

It is also an object of the invention to provide a method of making stacked capacitors, wherein flexible, foldable electrically conductive connectors are connected between electrode forming patterns of adjacent capacitor units, positioned in a predetermined manner on a supporting surface, so that, on folding the units into stacked relation, the alternate electrodes, are connected.

Another object of the invention is the provision of a method, which includes the steps of providing a preform for use in making stacked capacitors, said preform having a plurality of capacitor units disposed in checkerboard pattern with electrically conductive patterns of adjacent units connected in a predetermined manner by flexible, elongate foil connector strips, and then folding the units of the preforms into superposed stacked relation along lines extending transversely of the longitudinal axis of the respective strips so that electrode plates are formed in the stack and alternate plates are electrically connected by the foil strips to form two electrode groups, said strips for connecting one group of electrode plates being disposed in spaced relation to the strips for the other group of plates and all strips extending solely around the edges of their respective units.

Still another object of the invention is to provide preforms for making stacked capacitors which need only to be folded in a predetermined manner to form stacked capacitors having a plurality of electrodes separated by dielectric material, with alternate electrodes connected to form two electrode groups.

A further object of the invention is to provide a solder preform for use in soldering at least two solderable objects together which includes at least one of the objects to be soldered and solder in an amount sufficient to accomplish the desired soldering operation.

A still further object of the invention is to provide a method of making stacked capacitors which is simple and readily carried out by unskilled labor, is adapted to the application of high speed production procedures and produces a high reliability product at relatively low cost.

Other objects and advantages of the invention will be apparent from the specification and claims, when considered in connection with the attached sheets of drawings, illustrating one form of the invention, wherein like characters represent like parts, and in which:

Figures 1, 2, 3, 4, 5, 6, 7, 8, 9:
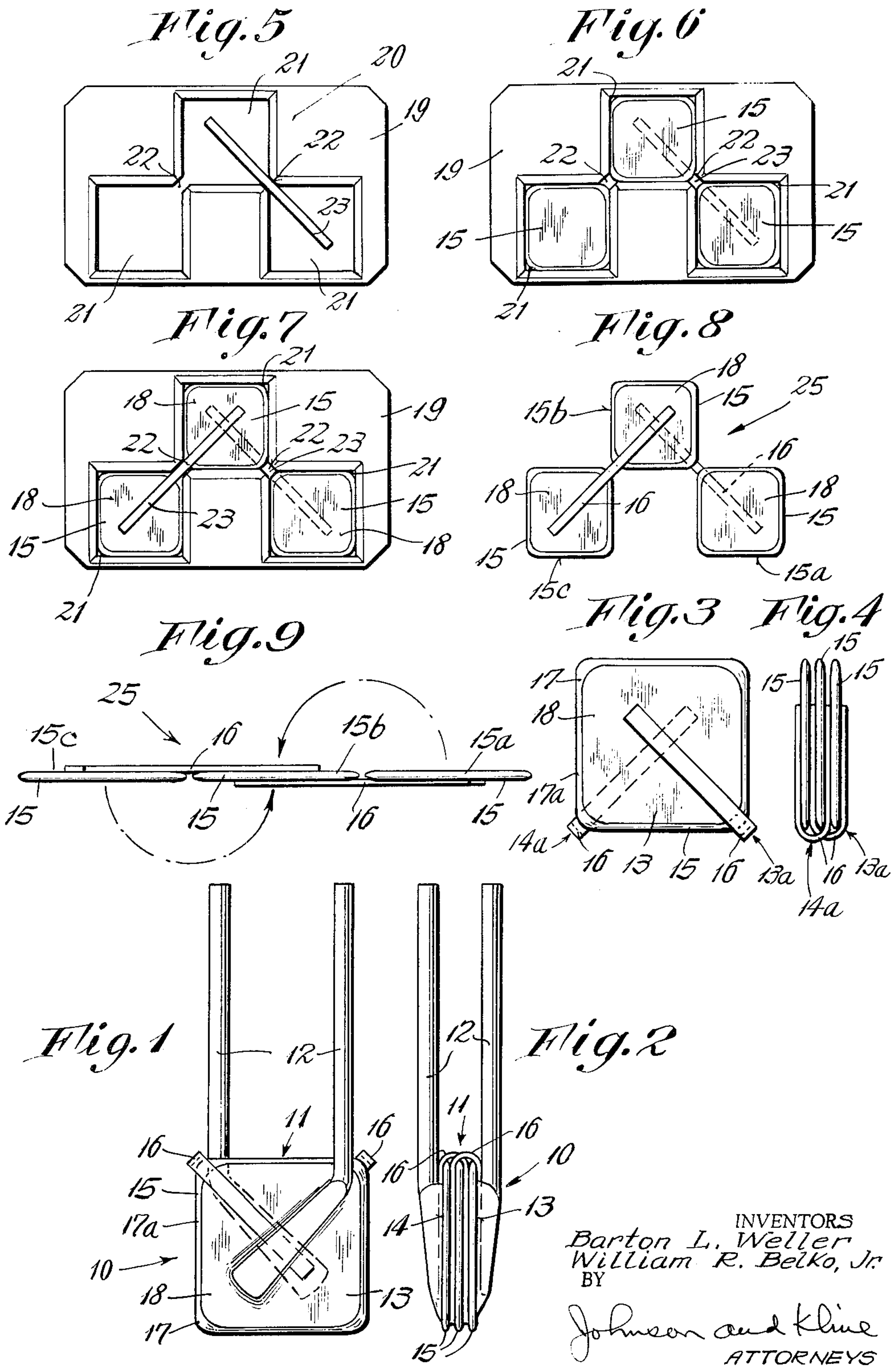
FIGURE 1 is an elevational view of a stacked capacitor made in accordance with the invention.
FIG. 2 is a side elevational view of the capacitor of FIG. 1.
FIG. 3 is a plan view of the capacitor of FIG. 1 without lead wires attached.
FIG. 4 is an edge view of the capacitor of FIG. 3.
FIGS. 5 through 9 are views illustrating the steps in the method of manufacturing a stacked capacitor according to the invention.

Referring now to the drawings for a more detailed description of the invention, in FIGS. 1 and 2 a stacked capacitor 10, according to the invention, is shown which includes a body, generally indicated by the numeral 11, having lead wires 12 connected thereto in any known manner. The lead wires, which are adapted to connect the capacitor 10 into an electrical circuit, are connected at opposite sides of the body 11 to electrodes or plates 13 and 14 of opposed electrode groups 13*a* and 14*a* of the device, the electrodes being formed in a manner to be hereinafter explained.

Figures 10, 11, 12, 13, 14:
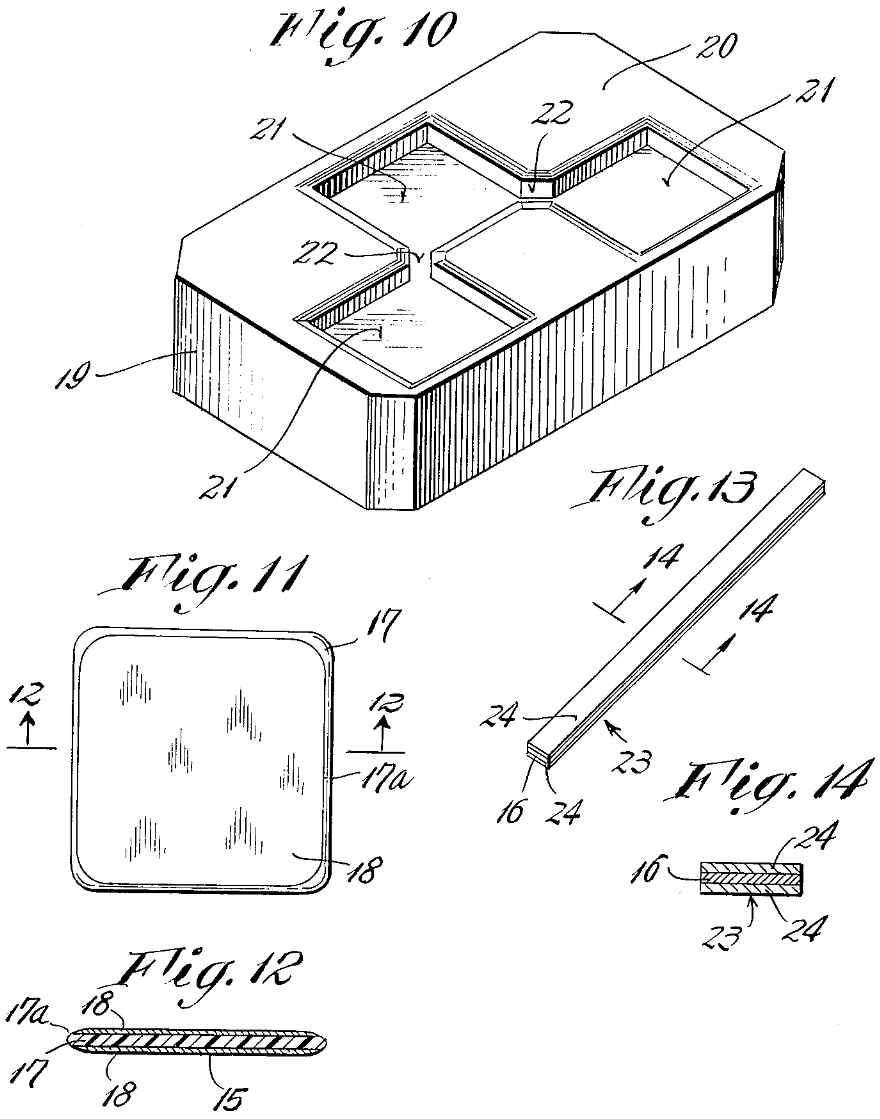
FIG. 10 is a perspective view of a support or jig for use in the method of the invention.
FIG. 11 is a plan view of capacitor unit for use in making the stacked capacitor, according to the invention, and comprises one of the elements of the capacitor preform.
FIG. 12 is a cross-sectional view of the capacitor unit of FIG. 11.
FIG. 13 is a perspective view of a solder foil preform for use in connecting adjacent capacitor units, according to the method of the invention, and providing the means for electrically connecting the alternate electrodes of the resultant stacked capacitor.
FIG. 14 is a cross-sectional view of the solder foil preform of FIG. 13.

The body 11, as shown in FIGS. 3 and 4, comprises a plurality of substantially identical capacitor units 15 (see FIGS. 11 and 12) stacked in superposed relation and includes a plurality of elongate, flexible electrically conductive foil connector strips 16 for electrically connecting alternate electrodes of the capacitor 10 and mechanically tying the units 15 together.

Each capacitor unit 15 comprises a wafer 17 of dielectric material, such as a ceramic or the like, having having identically shaped and oriented electrically conductive patterns 18 on the opposite surfaces thereof, the edges of the opposed patterns being separated by a border or other area 17*a* of the dielectric material of the wafer. In the stacked assembly of such capacitor units to form the body 11, the units are disposed in superposed engagement so that the engaging electrically conductive patterns 18 cooperate to form the electrode plates 13 and 14 of the finished capacitor. The foil connector strips 16 are folded into the stack, as shown most clearly in FIGS. 2 and 4, for electrically connecting the alternate electrodes, plates 13 and 14 respectively, formed by the cooperating electrically conductive patterns 18 to form the two electrode groups 13*a* and 14*a* of opposite polarity. It will be seen that as a result of this construction the inner electrodes of the body will each be formed from two engaging electrically conductive patterns 18, while the outer electrodes, that is those exposed at the outer surfaces of the body 11 and to which the lead wires 12 are attached, comprise a single electrically conductive pattern 18.

In the illustrated embodiment of the invention an uneven number of capacitor units 15 are utilized in forming the capacitor body 11, so that the outer plates or electrodes are of opposite electrode groups, thereby enabling the lead wires 12 to be readily attached to the surface of the body in the desired manner. It will be understood, of course, that the lead wires may be positioned to extend into the body, between the capacitor units 15, thus eliminating the necessity of restricting the stack to an assembly of an uneven number of units.

The foil connector strips, which are preferably connected to their capacitor units and electrically conductive patterns 18 prior to stacking the units, as will be hereinafter explained, are disposed in the stacked assembly in spaced relation to avoid short circuiting the capacitor and each extends in an open bight solely around the edges and across the borders 17*a* of the units 15 to which it is connected, such construction reducing the likelihood of the strip breaking and maintaining the electrode forming patterns in the closest possible proximity.

According to the invention, the stacked capacitor 10 is made by positioning the desired number of capictor units 15 on a supporting surface so that the electrically conductive patterns 18 which will ultimately form one group of electrode plates of the stacked capacitor face in one direction and the patterns for forming the other group face in the opposite direction. Thereafter the foil connector strips 16 are connected to corresponding electrode forming patterns 18, that are not adapted to be in engagement in the stacked assembly of the units, by positioning them to extend between adjacent units and across the borders 17*a* thereof and then soldering or otherwise electrically connecting the ends of the strips to the patterns. The capacitor preform which is thus provided is then folded to provide a stacked capacitor in which alternate electrode plates are electrically connected.

Referring now to FIGS. 5 through 9, the preferred method steps of the invention are shown in detail. As illustrated, a support or soldering jig 19 (see FIG. 10) is provided which includes a supporting surface 20 having recesses 21 therein in checkerboard pattern, each of which recesses is adapted to receive one capacitor unit 15 as will be hereinafter described. It will, of course, be understood that it is within the concept of the invention for the support 19 to have merely a flat supporting surface 20 without the recesses 21.

The surface 20 of the support 19 is provided with grooves or channels 22 therein for communicating adjacent corners of the recesses 21 and into one of these channels a foil connector strip is positioned. While a plain elongate, flexible foil connector strip may be used, in the preferred form of the invention a solder foil preform 23 (see FIGS. 13 and 14) is utilized to facilitate the subsequent steps of the method, as will be more clearly understood hereinafter. The solder foil preform comprises a sandwich including the connector strip 16 and layers of solder 24 bonded on the opposite surfaces thereof, such solder layers being of a thickness to provide sufficient solder for making the connections between the strips 16 and the electrically conductive patterns 18 of the units 15, as will be described.

After the solder foil preform 23 has been positioned in one of the channels 22 of the support 19, one capacitor unit 15 is inserted in each of the recesses 21, the patterns 18 thereof which face the support being adapted to form the electrode plates of one electrode group while the patterns directed away from the support are adapted to form the electrode plates of the other electrode group.

Following the insertion of the capacitor units 15 into the recesses 21, a second solder foil preform 23, or connector strip 16 if desired, is positioned in the vacant channel 22 to extend between the units 15, into which the channel opens, and into engagement with the upper electrically conductive patterns 18 of the units. It will be seen with reference to FIG. 7 that the foil strips or solder preforms 23 each are in engagement with corresponding electrode forming patterns that are not adapted to be in engagement in the stacked assembly of the capacitor.

The foil connector strips 16 are now electrically connected to their respective patterns in any manner known to the art. If plain foil connector strips have been utilized the connections may be made by soldering with a soldering iron or in like manner. Where the preforms 23 have been utilized the entire support 19 is placed in an oven, or the like, for melting the solder and making the connections between the strips 16 and their respective patterns in situ.

After the connections have been made the connected units are removed from the support to provide a capacitor preform 25 of the type shown in FIG. 8. The preforms 25, which may be stored for future use or immediately made into a stacked capacitor, as will be described, may include three capacitor units as indicated or any desired number of units, the foregoing steps being readily modified by one skilled in the art to produce a preform of the desired size.

In forming the capacitor preform 25 into a stacked capacitor, as shown in FIG. 9, the lower right hand unit 15*a* is folded around an imaginary line extending transversely of the longitudinal axis of its connector strip 16 so that its upper surface is in engagement with the upper surface of the unit 15*b* of the preform. Similarly, the unit 15*c* is folded around an imaginary line extending transversely of the longitudinal axis of its connector strip 16 so that its undersurface is in engagement with the undersurface of unit 15*b*.

It will be seen that by folding the capacitor units into a stacked assembly in the foregoing manner, a capacitor body 11 is provided in which alternate electrode plates, formed by cooperating electrically conductive patterns 18, are connected by electrically conductive connectors 16 in the desired manner. It will be further seen that the resultant body has the connector strips 16 spaced in such a manner that the possibility of short circuits is eliminated and each of the connector strips is folded with an open bight to extend solely around the edges of its respective capacitor units.

By means of the foregoing method the problems of the prior art, inherent with forming electrically conductive patterns of varied shape and/or orientation on a wafer, are eliminated, since there is no necessity for having the patterns vary in shape and orientation, and also eliminated are the difficulties encountered in aligning engaging patterns to form electrode plates of the stacked capacitor, as required by the prior art.

Thus, among others, the several objects and advantages of the invention as aforenoted are achieved. Obviously numerous changes in the method and structures may be resorted to without departing from the spirit of the invention as defined by the claims.

We claim:

1. The method of making a capacitor comprising the steps of providing a plurality of capacitor units adapted to be stacked in superposed relation, each of said units including a wafer of dielectric material having first and second electrically conductive patterns on opposite surfaces thereof respectively, said patterns being spaced inwardly of the edges of their respective wafer so that a border of dielectric material extends completely therearound and corresponding patterns of adjacent units being adapted in the stacked assembly thereof to be in engagement to cooperatively form an electrode plate of the capacitor; positioning said units relative to each other in checkerboard pattern with corresponding electrically conductive patterns facing in the same direction; electrically connecting said first patterns in adjacent units which are not adapted to be in engagement in the stacked assembly of the units by a flexible connector extending diagonally between the respective units and across the borders thereof; electrically connecting said second patterns in adjacent units which are not adapted to be in engagement in the stacked assembly of the units by a flexible connector extending diagonally between the respective units and across the borders thereof; and then folding said units into superposed stacked relation so that corresponding patterns of adjacent units are in engagement for forming the electrode plates of the capacitor and the connectors for said first patterns are disposed in spaced relation to the connectors for the second patterns with each connector extending solely around the edges and across the borders of its respective units for electrically connecting alternate electrode plates in the capacitor.

2. The method of making a capacitor comprising the steps of providing a plurality of capacitor units adapted to be stacked in superposed relation, each of said units including a wafer of dielectric material having first and second electrically conductive patterns on opposite surfaces thereof respectively, said patterns being spaced inwardly of the edges of their respective wafer so that a border of dielectric material extends completely therearound and corresponding patterns of adjacent units being adapted in the stacked assembly thereof to be in engagement to cooperatively form an electrode plate of the capacitor; positioning said units relative to each other in checkerboard pattern with corresponding electrically conductive patterns facing in the same direction; electrically connecting said first patterns in adjacent units which are not adapted to be in engagement in the stacked assembly of the units by a flexible elongate connector extending longitudinally diagonally between the respective units and across the borders thereof; electrically connecting said second patterns in adjacent units which are not adapted to be in engagement in the stacked assembly of the units by a flexible elongate connector extending longitudinally diagonally between the respective units and across the borders thereof; and then folding said units into superposed stacked relation along a line extending transversely of the longitudinal axis of said connectors so that corresponding patterns of adjacent units are in engagement for forming the electrode plates of the capacitor and the connectors for said first patterns are disposed in spaced relation to the connectors for the second patterns with each connector extending solely around the edges and across the borders of its respective units for electrically connecting alternate electrode plates in the capacitor.

3. The method of making a capacitor comprising the steps of providing a plurality of capacitor units adapted to be stacked in superposed relation, each of said units including a rectangular wafer of dielectric material having first and second electrically conductive patterns on opposite surfaces thereof respectively, said patterns being spaced inwardly of the edges of their respective wafer so that a border of dielectric material extends completely therearound and corresponding patterns of adjacent units being adapted in the stacked assembly thereof to be in engagement to cooperatively form an electrode plate of the capacitor; positioning said units relative to each other in checkerboard pattern with corresponding electrically conductive patterns facing in the same direction; electrically connecting said first patterns in adjacent units which are not adapted to be in engagement in the stacked assembly of the units by a flexible connector extending diagonally between the respective units and across the borders at the corners thereof; electrically connecting said second patterns in adjacent units which are not adapted to be in engagement in the stacked assembly of the units by a flexible connector extending diagonally between the respective units and across the borders at the corners thereof; and then folding said units into superposed stacked relation by pivoting them around the corners across which the connectors extend so that corresponding patterns of adjacent units are in engagement for forming the electrode plates of the capacitor and the connectors for said first patterns are disposed in spaced relation to the connectors for the second patterns with each connector extending solely around the edges and across the borders of its respective units for electrically connecting alternate electrode plates in the capacitor.

4. The method of making a capacitor comprising the steps of providing a plurality of capacitor units adapted to be stacked in superposed relation, each of said units including a wafer of dielectric material having first and second electrically conductive patterns on opposite surfaces thereof respectively, said patterns being spaced inwardly of the edges of their respective wafer so that a border of dielectric material extends completely therearound and corresponding patterns of adjacent units being adapted in the stacked assembly thereof to be in engagement to cooperatively form an electrode plate of the capacitor; providing a support having formed in a surface thereof a plurality of recesses in checkerboard pattern adapted to each receive one of said units; positioning said units in the recesses with corresponding electrically conductive patterns facing in the same direction; electrically connecting said first patterns in adjacent units which are not adapted to be in engagement in the stacked assembly of the units by positioning a flexible elongate connector to extend diagonally between the respective units and across the borders thereof into engagement with said first patterns; electrically connecting said second patterns in adjacent units which are not adapted to be in engagement in the stacked assembly of the units by positioning a flexible elongate connector to extend diagonally between the respective units and across the borders thereof into engagement with said second patterns; soldering the connectors to their respective patterns while said units are retained in said recesses; and then removing said units from said recesses and folding them into superposed stacked relation so that corresponding patterns of adjacent units are in engagement for forming the electrode plates of the capacitor and the connectors for said first patterns are disposed in spaced relation to the connectors for the second patterns with each connector extending solely around the edges and across the borders of its respective units for electrically connecting alternate electrode plates in the capacitor.

5. The method of making a capacitor comprising the steps of providing a plurality of capacitor units adapted to be stacked in superposed relation, each of said units including a wafer of dielectric material having first and second electrically conductive patterns on opposite surfaces thereof respectively, said patterns being spaced inwardly of the edges of their respective wafer so that a border of dielectric material extends completely therearound and corresponding patterns of adjacent units being adapted in the stacked assembly thereof to be in engagement to cooperatively form an eletrode plate of the capacitor; providing a support having formed in a surface thereof a plurality of recesses in checkerboard pattern adapted to each receive one of said units; positioning said units in the recesses with corresponding electrically conductive patterns facing in the same direction; positioning a flexible elongate solder foil connector preform in engagament with said first patterns in adjacent units which are not adapted to be in engagement in the stacked assembly of the units by extending said preform diagonally between the respective units and across the borders thereof; positioning a flexible elongate solder foil connector preform in engagement with said second patterns in adjacent units which are not adapted to be in engagement in the stacked assembly of the units by extending said preform diagonally between the respective units and across the borders thereof; electrically connecting said first and second patterns respectively by heating said units in situ on said support to melt the solder of the preforms and thereby connect the foil connectors of the preforms to their respective patterns; and then removing the units from the recesses and folding them into superposed stacked relation so that corresponding patterns of adjacent units are in engagement for forming the electrode plates of the capacitor and the foil connectors for said first patterns are disposed in spaced relation to the foil connectors for the second patterns with each connector extending solely around the edges and across the borders of its respective units for electrically connecting alternate electrode plates in the capacitor.

6. The method of making a capacitor comprising the steps of providing a plurality of capacitor units adapted to be stacked in superposed relation, each of said units including a rectangular wafer of dielectric material having first and second electrically conductive patterns on opposite surfaces thereof respectively, said patterns being spaced inwardly of the edges of their respective wafer so that a border of dielectric material extends completely therearound and corresponding patterns of adjacent units being adapted in the stacked assembly thereof to be in engagement to cooperatively form an electrode plate of the capacitor; providing a support having formed in a surface thereof a plurality of rectangular recesses in checkerboard pattern adapted to each receive one of said units and a plurality of open channels between said recesses, said channels extending between adjacent corners of diagonally adjacent recesses for openly connecting such recesses; positioning said units in the recesses with corresponding electrically conductive patterns facing in the same direction; positioning a flexible elongate solder foil connector preform in engagement with said first patterns in adjacent units which are not adapted to be in engagement in the stacked assembly of the units by placing the preform in the respective channel for such units to extend across the borders of the units; positioning a flexible elongate solder foil connector preform in engagement with said second patterns in adjacent units which are not adapted to be in engagement in the stacked assembly of the units by placing the preform in the respective channel for such units to extend across the borders of the units; electrically connecting said first and second patterns respectively by heating said units in situ on said support to melt the solder of the preforms and thereby connect the foil connectors of the preforms to their respective patterns; and then removing the units form the recesses and folding them into superposed stacked relation so that corresponding patterns of adjacent units are in engagement for forming the electrode plates of the capacitor and the foil connectors for said first patterns are disposed in spaced relation to the foil connectors for the second patterns with each connector extending solely around the edges and across the borders of its respective units for electrically connecting alternate electrode plates in the capacitor.

References Cited by the Examiner

UNITED STATES PATENTS

| | | | |
|---|---|---|---|
| 2,602,988 | 7/1952 | Klym | 29—190 |
| 2,664,844 | 1/1954 | Siegrist | 113—110 |
| 2,839,816 | 6/1958 | McGraw | 29—25.42 |
| 2,978,789 | 4/1961 | Randels | 29—25.42 |
| 2,991,540 | 7/1961 | Gaut | 29—25.42 |
| 3,002,481 | 10/1961 | Hutters | 113—110 |
| 3,065,525 | 11/1962 | Ingraham | 29—190 |

RICHARD H. EANES, Jr., *Primary Examiner.*